(12) United States Patent
Nitschke

(10) Patent No.: US 10,176,970 B2
(45) Date of Patent: Jan. 8, 2019

(54) REDUNDANT POWER SUPPLY SYSTEM FOR A PLASMA PROCESS

(71) Applicant: TRUMPF Huettinger GmbH + Co. KG, Freiburg (DE)

(72) Inventor: Moritz Nitschke, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 15/670,074

(22) Filed: Aug. 7, 2017

(65) Prior Publication Data

US 2017/0358429 A1    Dec. 14, 2017

Related U.S. Application Data

(63) Continuation of application No. PCT/EP2016/052698, filed on Feb. 9, 2016.

(30) Foreign Application Priority Data

Feb. 10, 2015  (DE) .................. 10 2015 202 317

(51) Int. Cl.
*H01J 37/32* (2006.01)
*H02J 3/14* (2006.01)
(Continued)

(52) U.S. Cl.
CPC .. *H01J 37/32174* (2013.01); *H01J 37/32045* (2013.01); *H01J 37/32082* (2013.01);
(Continued)

(58) Field of Classification Search
None
See application file for complete search history.

(56) References Cited

U.S. PATENT DOCUMENTS 3,999,078 A     12/1976  Udvardi
7,508,093 B2 *   3/2009  Wiedemuth ...... H01J 37/32577
                                                    307/147
(Continued)

FOREIGN PATENT DOCUMENTS

CH         599702 A5    5/1978
DE    102006057529 B4    4/2012
(Continued)

OTHER PUBLICATIONS

International Search Report for PCT Application No. PCT/EP2016/052698, dated Apr. 29, 2016, 6 pages.

*Primary Examiner* — Douglas W Owens
*Assistant Examiner* — Srinivas Sathiraju
(74) *Attorney, Agent, or Firm* — Fish & Richardson P.C.

(57) ABSTRACT

A power supply system for a plasma process includes two separate power supplies of essentially identical performance characteristics, including a first power supply and a second power supply, and a data transfer connection operably coupling the two power supplies for data communication between the two power supplies. The first power supply is configured to: receive, in a standby mode, data via the data transfer connection from the second power supply supplying power to a plasma process in a normal operating mode, and supply, in an active backup mode, power to the plasma process in place of the second power supply, as a function of the received data. The first power supply can supply in the active backup mode to the plasma process the power having one or more characteristics that are substantially the same as those of the power provided by the second power supply in the normal operating mode.

20 Claims, 2 Drawing Sheets

(51) Int. Cl.
*H02J 9/06* (2006.01)
*H03F 3/217* (2006.01)

(52) U.S. Cl.
CPC .. *H01J 37/32155* (2013.01); *H01J 37/32917* (2013.01); *H01J 37/32926* (2013.01); *H01J 37/32935* (2013.01); *H01J 37/32944* (2013.01); *H02J 3/14* (2013.01); *H02J 9/062* (2013.01); *H03F 3/2175* (2013.01)

(56) References Cited

U.S. PATENT DOCUMENTS

| | | | | |
|---|---|---|---|---|
| 8,044,595 | B2* | 10/2011 | Nitschke | H01J 37/32623 |
| | | | | 204/192.15 |
| 9,111,718 | B2* | 8/2015 | Merte | H01J 37/32174 |
| 9,276,456 | B2* | 3/2016 | Grede | H02M 7/53873 |
| 9,684,327 | B2* | 6/2017 | Fritsch | H01J 37/32174 |
| 2007/0024362 | A1* | 2/2007 | Radomski | H03F 1/0277 |
| | | | | 330/123 |
| 2007/0044715 | A1* | 3/2007 | Blattner | H01J 37/32165 |
| | | | | 118/723 I |
| 2007/0145900 | A1* | 6/2007 | Kirchmeier | H01J 37/32082 |
| | | | | 315/111.21 |
| 2008/0150361 | A1* | 6/2008 | Helde | H01J 37/32045 |
| | | | | 307/31 |
| 2009/0289034 | A1* | 11/2009 | Nitschke | H01J 37/32623 |
| | | | | 216/67 |
| 2015/0288274 | A1 | 10/2015 | Grede et al. | |
| 2017/0358429 | A1* | 12/2017 | Nitschke | H01J 37/32174 |

FOREIGN PATENT DOCUMENTS

| | | |
|---|---|---|
| DE | 10260726 B4 | 10/2014 |
| EP | 1783904 B1 | 4/2008 |
| EP | 2095392 B1 | 9/2010 |
| EP | 1753011 B1 | 10/2012 |
| EP | 2763314 A1 | 8/2014 |
| WO | WO2008061775 A1 | 5/2008 |
| WO | WO2014094737 A2 | 6/2014 |

\* cited by examiner

REDUNDANT POWER SUPPLY SYSTEM FOR A PLASMA PROCESS

CROSS-REFERENCE TO RELATED APPLICATIONS

This application is a continuation of and claims priority under 35 U.S.C. § 120 to PCT Application No. PCT/EP2016/052698 filed on Feb. 9, 2016, which claims priority to German Application No. 10 2015 202 317.6 filed on Feb. 10, 2015. The entire contents of these priority applications are incorporated herein by reference.

TECHNICAL FIELD

The invention relates to a power supply system for a plasma process, including a first power supply and a second, redundant power supply of identical or similar design.

BACKGROUND

Plasma processes that run in a plasma chamber and are used, for example, for treating semiconductor wafers, are supplied with power by a power supply. In this application, the power supply runs in a normal operating mode, in which it delivers the power in a required form to the plasma chamber. As plasma processes are highly sensitive processes, disruptions to the plasma processes can cause damage to the wafers being treated in the plasma chamber. An unexpected failure of a power supply can at least make an entire wafer unusable. In addition, such a failure can disable an entire production process. Thus, a large amount of damage can occur in a relatively short time.

SUMMARY

One object of the invention is to provide a power supply and a power supply system that can be used to achieve a greater process reliability.

One aspect of the invention features a power supply system for a plasma process, which has a first power supply and a second, redundant power supply of identical or similar design, the first power supply and second power supply being connected for data communication via a data transfer connection, and the first power supply being designed to receive, in a standby mode, data from the second power supply, which is working in a normal operating mode, that are needed to supply, in place of the second power supply, to the plasma process the power provided so far to the plasma process by the second power supply. Thus in the event of a power supply failure, the other power supply can continue to provide to the plasma process exactly the power that was previously provided by the failed power supply entirely without interruption or only with minimal interruption. The faulty power supply can then be repaired or replaced without harming the plasma process. Although at first it is more expensive to provide at least two power supplies and to operate one of the power supplies initially only in a standby mode, these costs are negligible considering the financial damage that may arise when a power supply fails. Moreover, it appears possible to retrofit an additional power supply to an existing power supply system including one power supply, which makes possible for the additional power supply to be operated both in a normal mode and in a standby mode.

Another aspect of the invention features a power supply system for a plasma process includes two separate power supplies of essentially identical performance characteristics, including a first power supply and a second power supply, and a data transfer connection operably coupling the two power supplies for data communication between the two power supplies. The first power supply is configured to: receive, in a standby mode, data via the data transfer connection from the second power supply supplying power to a plasma process in a normal operating mode, and supply, in an active backup mode, power to the plasma process in place of the second power supply, as a function of the received data. The first power supply can be configured to supply in the active backup mode to the plasma process the power having one or more characteristics that are substantially the same as those of the power provided by the second power supply in the normal operating mode. The characteristics can include at least one of voltage, current, frequency, and power level.

A further aspect of the invention features a power supply for supplying plasma processes with power, including: an interface connectable to an additional power supply for data communication via a data transfer connection; a power output for outputting a power signal; and a power generator configured to: generate, in a standby mode, a lower power at the power output than in an active backup mode, and generate, in the active backup mode, an adjustable power at the power output for supplying the plasma processes. The power supply is configured to: receive, in the standby mode, data at the interface via the data transfer connection from the additional power supply working in a normal operating mode to supply power to a plasma process, generate by the power generator in the active backup mode, power to the plasma process as a function of the received data, and supply, at the power output, the generated power to the plasma process in place of the additional power supply.

Another aspect of the invention features a first power supply for supplying plasma processes with power, which is designed to work in a standby mode, in which it generates at its output a lower power than in a normal operating mode, and in the normal operating mode, in which it generates an adjustable power at its output for supplying plasma processes with power, the first power supply being designed to receive, in the standby mode, data from a second power supply, which is working in a normal operating mode, that are needed to supply, in place of the second power supply, to the plasma process the power provided so far to the plasma process by the second power supply. Such a power supply can be used as a redundant power supply in a power supply system described above.

The first power supply can be designed to be switched over into the normal operating mode within a very short interruption period. In some cases, the interruption period is less than 10 µs, in particular less than 1 µs and more preferably less than 0.2 µs. Then the plasma can continue to be maintained and is not disrupted for longer than, for instance, that which occurs during a power supply interruption caused by arc detection and processing.

The frequency of an output signal from the first power supply can be adjustable, and the first power supply can be designed to provide an output signal of the same frequency as the output signal from the second power supply. It can hence be ensured that the first power supply provides the plasma chamber with a power signal that is the same as that previously provided by the second power supply, and that the plasma process is not disrupted.

The first and second power supplies may be suitable for working in pulsed operating mode having a pulse frequency and a pulse length, in particular for pulsing between two power levels in a pulsed operating mode. The first power supply can be designed to provide, after switching over from the standby mode to the normal operating mode, the same pulse frequency, pulse length and power levels as the second power supply. In particular, the first power supply can be designed to continue to pulse synchronously. Thus, during the normal operating mode, the second power supply can provide its specific setting values to the first power supply being operated in standby, with the result that the first power supply can run up to the currently required power and can supply the plasma process with power very quickly after a failure of the second power supply. It is hence possible to satisfy the exacting requirements of the semiconductor industry with regard to repeatability.

At least one power supply can include a plurality of amplifiers and a combiner, the combiner combining the powers from the amplifiers connected thereto. Power supplies embodied in this way are particularly robust. In particular, they can cope especially well with power reflected at the plasma chamber.

The power supplies each can include a power output, the power outputs of the power supplies being connected to a connecting element (or a connector). This avoids the need to connect the power supplies in parallel to a plasma chamber. It is only necessary to connect the connecting element to the plasma chamber.

The connecting element can be in the form of a matchbox (matching network) and/or a combiner. It is thereby possible to switch over particularly easily from one power supply to the other power supply without matching problems arising.

Each power supply preferably includes an arc management system. Hence if arcs arise in the plasma chamber, each of the power supplies can respond to the arc, depending on which of the power supplies is currently working in a normal operating mode. It is advantageous in this context if adaptively correcting detection thresholds, variations in frequency or pulse frequency or pulse rate, and the relevant data for running a Joule mode, are transferred from one power supply to the other power supply, in particular said data are exchanged.

A further aspect of the invention features a method of operating a plasma process in a plasma chamber. The method includes the following method steps of:

a. operating a first power supply in a standby mode;
b. operating a second power supply in a normal operating mode, and supplying a plasma process in a plasma chamber with power;
c. monitoring at least one parameter of the second power supply; and
d. the first power supply changing over from the standby mode into the normal operating mode, and supplying the plasma process in the plasma chamber with power if the monitoring of the parameter of the second power supply detects a predetermined event.

In the standby mode, the first power supply preferably does not supply any power at its output, or at most supplies a power that is much lower than the power that is generated when the power supply is operated in the normal operating mode.

The predetermined event may be detecting a failure of the second power supply. It may also be detecting an imminent failure of the second power supply. It may also be one or more of the following events or imminent events:
voltage drop, current drop or power drop,
overheating or other unusual temperature variation
partial failure,
failure of a component of the second power supply,
occurrence of electrical, magnetic or electromagnetic interference signals,
leakage e.g. of coolants or from the housing,
fire detection,
triggering of a safety mechanism, e.g. to protect human life when manual interventions are made in dangerous components, and
disconnection of necessary data connections.

As parameters, one or more of the following values at one or more components or locations of the second power supply can be monitored:
the voltage,
the power,
the current,
the temperature,
electromagnetic radiation including X-ray radiation, light emitted in the visible or invisible region,
flow rate of the coolant,
composition of the ambient air, e.g., with regard to smoke, toxic substances, moisture, and
mechanical properties such as pressure, tension, length, noises, vibrations.

The parameter can be monitored in the second power supply. Alternatively or additionally, the parameter can be monitored in the first power supply. The first power supply and second power supply can each be configured for this purpose. Alternatively or additionally, the parameter can be monitored in a higher-level controller. In some cases, one or more parameters can be monitored together.

Detecting the predetermined event can be performed in the second power supply. Alternatively or additionally, detecting the predetermined event can be performed in the first power supply. The first power supply and second power supply can each be configured for this purpose. Alternatively or additionally, detecting the predetermined event can take place in a higher-level controller.

The second power supply can be switched off when the predetermined event is detected. This can be necessary in particular when detecting the predetermined event does not relate to the failure of the second power supply but only to the expected or imminent failure.

Momentary interruptions can arise during the changeover from a standby mode into a normal operating mode. These interruptions can be allowed to be as long as those also arising during arc processing. These interruptions can be less than 10 µs, in particular less than 1 µs and more preferably less than 0.2 µs.

Data can be exchanged continuously between the first power supply and the second power supply. This can ensure that the changeover from one power supply to the other power supply takes place with the very short interruptions described above and that the plasma process is not disrupted.

The second power supply can provide, as data to the first power supply, for example, settings, in particular arc detection thresholds, the frequency of the output signal, the pulse frequency of the output signal, the pulse rate of the output signal, setpoint power, setpoint current and/or setpoint voltage, and the first power supply can update its values accordingly.

The first power supply and the second power supply can be matched and calibrated to one another. In particular, the power supplies can run a mutual calibration mode before the start of the plasma process. In this mode, the power can be run up to different power levels and checks can be performed to verify that both power supplies are exactly calibrated to match one another at each power level. It is hence possible to satisfy the exacting requirements of the semiconductor industry with regard to repeatability. In this process, a measurement can advantageously be made of the power between the connecting element and the plasma chamber.

DC (direct current) link voltages of the first power supply, which is being operated in a standby mode, can be updated to match the DC link voltages of the second power supply. This can hence ensure that the first power supply operated in the standby mode provides, after the switchover from the standby mode to the normal operating mode of the first power supply, practically the same power as provided by the second power supply.

Chokes of the first power supply, which is being operated in the standby mode, can be supplied in advance with a current. Energy storage devices, in particular capacitors, which are provided for arc processing, can be precharged. In particular, anything which may take time but does not result in a load on the power supply being operated in the standby mode can be enabled and adjusted. In addition, AC (alternating current) current sources of the power supplies can be synchronized. This can also take place in the calibration mode. All the measures contribute to the power supply operated in the standby mode being able to take over supplying power to the plasma process practically without interruption.

The method steps described can be used in particular in one of the power supply systems having the features described above. For the purpose of implementing the method, the first power supply and the second power supply can be in particular power supplies having the characteristics described above.

Further features and advantages of the invention will become apparent from the following detailed description of embodiments of the invention, with reference to the figure in the drawings, which show details essential to the invention, and from the claims. The features shown in the drawings shall not be considered necessarily to scale and are depicted in a manner that allows the characteristics according to the invention to be clearly visible. In variants of the invention, the various features can each be implemented individually or in a manner grouped together in any desired combinations.

Embodiments of the invention are explained in greater detail in the following description and depicted in the schematic drawings, in which:

DETAILED DESCRIPTION

Figure 1:
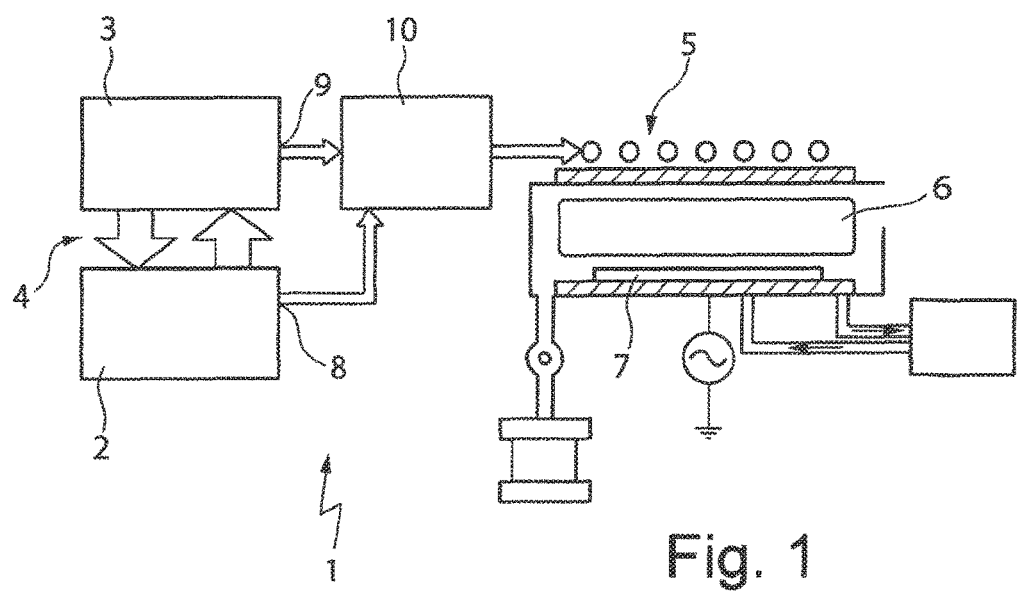
FIG. 1 is a schematic view of a power supply system.

FIG. 1 shows a power supply system 1 having a first power supply 2 and a second power supply 3. The power supplies 2, 3 are interconnected for data communication via a data transfer connection 4. Each of the power supplies 2, 3 is suitable for supplying a plasma process in a plasma chamber 5 with power such that a plasma 6 can be produced in the plasma chamber 5 and a plasma process can be carried out in which, for example, a wafer 7 can be treated. The first power supply 2 is initially operated in a standby mode. The first power supply 2 is designed (or configured) to generate, in a standby mode, a lower power at its output 8 than in a normal operating mode (or an active backup mode). In the normal operating mode, the first power supply 2 can generate an adjustable power at its output 8 for supplying the plasma process in the plasma chamber 5 with power. In the standby mode, the first power supply 2 can receive data from the second power supply 3, which is working in the normal operating mode. In particular, the first power supply 2 can receive such data that are needed to supply to the plasma process, within an above-described momentary interruption after the detection of the predetermined event, in place of the second power supply 3, the power provided so far to the plasma process by the second power supply 3.

The second power supply 3 likewise includes an output 9 at which power can be output. The two power supplies 2, 3 are connected to a connecting element (or connector) 10, which is in the form of a coupler and/or an impedance matching network. The first power supply 2 or the second power supply 3, depending on which of the power supplies 2, 3 is working in the normal operating mode, can provide power to the plasma chamber 5 via the connecting element 10.

If the second power supply 3 fails, then the first power supply 2 is activated to be brought out of the standby mode, such that the first power supply 2 can take over supplying power to the plasma chamber 5. An uninterrupted supply of power or an uninterrupted switchover from the second power supply 3 to the first power supply 2 is ensured by data being exchanged continuously via the data transfer connection 4. Numerous parameters and setpoint values can thereby be updated in the first power supply 2 such that the first power supply 2 can take over the supply of power immediately without further adjustments when it is activated.

Once the first power supply 2 has been activated, the second power supply 9 can either be replaced, switched off or operated in a standby mode. In particular, it is also possible to operate the power supplies 2, 3 alternately in the standby mode and/or alternately in the normal operating mode to prevent premature aging of one of the power supplies 2, 3.

Figure 2:
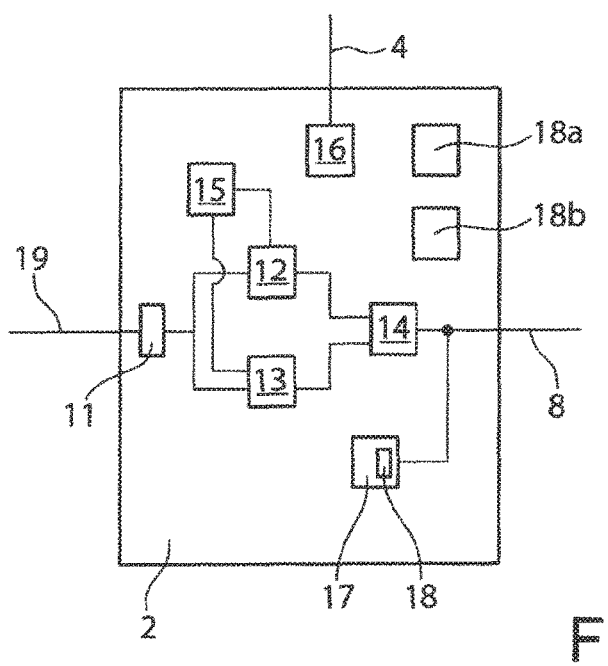
FIG. 2 is a schematic view of a power supply.

FIG. 2 shows a schematic diagram of the first power supply 2, and it is possible for the second power supply 3 to have an identical design. The two power supplies can have essentially identical performance characteristics. The first power supply 2 can be connected by an input 19 to a power supply network. Arranged after the input 19 is a mains rectifier 11, which generates a DC link voltage at its output. In turn, connected to the DC link voltage are amplifiers 12, 13, the outputs of which lead to a combiner 14, which is connected to the output 8. The amplifiers 12, 13 can be controlled via a controller 15. A monitoring device (or a monitor) 16, which monitors at least one parameter of the second power supply and checks whether a predetermined event exists, can be connected to the data transfer connection 4. In addition, an arc management system 17 can be provided that includes an energy storage device 18, e.g., a capacitor. Additional energy storage devices 18a, 18b can also be provided outside the arc management system. Such an energy storage device may be in the form of a choke 18b.

Figure 3:
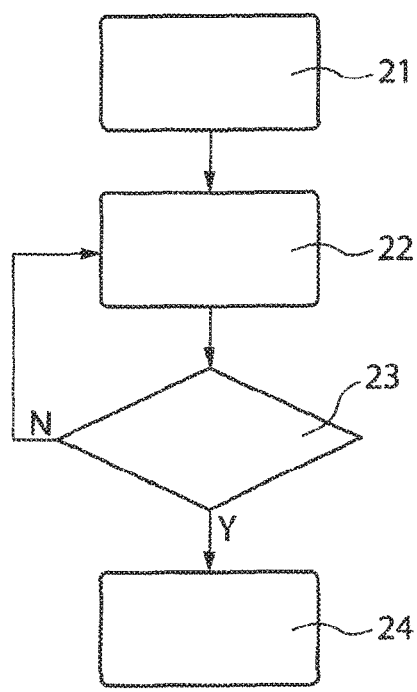
FIG. 3 is a flow diagram illustrating a method of operating the power supply system.

The method of operating the power supply system 1 is illustrated in FIG. 3. In step 21, a first power supply 2 is operated in a standby mode and a second power supply 3 is operated in a normal operating mode to supply a plasma process in a plasma chamber 5 with power.

In step 22, a parameter of the second power supply is monitored.

In step 23, a decision is made as to whether a predetermined event has been detected during the monitoring the parameter. If such an event is detected, then the path Y is taken and in step 24, the first power supply is switched over from the standby mode into the normal operating mode to supply the plasma process in the plasma chamber with power. If no such event is detected in step 23, then the path N is taken and in step 22, the parameter of the second power supply is monitored again.

A number of embodiments of the invention have been described. Nevertheless, it will be understood that various modifications may be made without departing from the spirit and scope of the invention. Accordingly, other embodiments are within the scope of the following claims.

What is claimed is:

1. A power supply system for a plasma process, comprising:
   two separate power supplies of essentially identical performance characteristics, including a first power supply and a second power supply; and
   a data transfer connection operably coupling the two power supplies for data communication between the two power supplies;
   wherein the first power supply is configured to:
      receive, in a standby mode, data via the data transfer connection from the second power supply supplying power to a plasma process in a normal operating mode, and
      supply, in an active backup mode, power to the plasma process in place of the second power supply, as a function of the received data.

2. The power supply system of claim 1, wherein the first power supply is configured to supply in the active backup mode to the plasma process the power having one or more characteristics that are the same as those of the power provided by the second power supply in the normal operating mode.

3. The power supply system of claim 1, wherein the first power supply is configured to:
   generate, in the standby mode, a lower power than in the active backup mode, and
   generate, in the active backup mode, an adjustable power for supplying the plasma process.

4. The power supply system of claim 1, wherein a frequency of an output signal from one of the first power supply and the second power supply is adjustable, and
   wherein the first power supply is configured to provide, after switching over from the standby mode into the active backup mode, an output signal having the same frequency as an output signal from the second power supply.

5. The power supply system of claim 1, wherein the first power supply and the second power supply are configured to work in a pulsed operating mode having a pulse frequency and a pulse length and pulse between power levels in the pulsed operating mode, and
   wherein the first power supply is configured to provide, after switching over from the standby mode into the active backup mode, the same pulse frequency, pulse length and power levels as the second power supply.

6. The power supply system of claim 1, wherein the first power supply is configured to be switched over from the standby mode into the active backup mode within an interruption period less than 10 µs.

7. The power supply system of claim 1, wherein at least one of the two power supplies comprises a plurality of amplifiers and a combiner, and
   wherein the combiner is configured to be connected to the plurality of amplifiers and combine powers from the plurality of amplifiers.

8. The power supply system of claim 1, wherein each of the two power supplies comprises a power output connected to a connector that is further coupled to a plasma chamber where the plasma process occurs.

9. The power supply system of claim 1, wherein each of the two power supplies comprises an arc management system.

10. A method of operating a plasma process in a plasma chamber, comprising:
    operating a first power supply in a standby mode;
    operating a second power supply in a normal operating mode to supply power to the plasma process in the plasma chamber;
    monitoring at least one parameter of the second power supply; and
    if the monitoring of the parameter of the second power supply detects a predetermined event, changing the first power supply over from the standby mode into an active backup mode to supply the plasma process in the plasma chamber with power having one or more characteristics that are the same as those of the power provided by the second power supply to the plasma process in the normal operating mode.

11. The method of claim 10, further comprising:
    continuously exchanging data between the first power supply and the second power supply.

12. The method of claim 11, further comprising:
    providing, by the second power supply, as the data to the first power supply, at least one of settings, arc detection thresholds, a frequency of an output signal, a pulse frequency of the output signal, a pulse rate of the output signal, a setpoint power, a setpoint current, and a setpoint voltage; and
    updating, by the first power supply, its corresponding values based on the data provided by the second power supply.

13. The method of claim 12, wherein monitoring at least one parameter of the second power supply comprises:
    monitoring one or more values of the data at one or more components or locations of the second power supply.

14. The method of claim 10, wherein the predetermined event indicates one of an expected failure, an imminent failure, and a failure of the second power supply.

15. The method of claim 10, further comprising:
    matching and calibrating the first power supply and the second power supply to each other.

16. The method of claim 10, wherein changing the first power supply over from the standby mode into the active backup mode comprises:
    updating DC link voltages of the first power supply operated in the standby mode to match DC link voltages of the second power supply operated in the normal operating mode.

17. The method of claim 10, wherein operating the first power supply in the standby mode comprises:
    supplying one or more chokes of the first power supply in advance with a current.

18. The method of claim 10, further comprising:
    precharging an energy storage device of the first power supply, the energy storage device configured for arc processing in the plasma chamber.

19. The method of claim 10, further comprising:
    synchronizing respective AC current sources of the first and second power supplies.

20. A power supply for supplying plasma processes with power, comprising:

an interface connectable to an additional power supply for data communication via a data transfer connection;
a power output for outputting a power signal; and
a power generator configured to:
   generate, in a standby mode, a lower power at the power output than in an active backup mode, and
   generate, in the active backup mode, an adjustable power at the power output for supplying the plasma processes,
wherein the power supply is configured to:
   receive, in the standby mode, data at the interface via the data transfer connection from the additional power supply working in a normal operating mode to supply power to a plasma process,
   generate by the power generator in the active backup mode, power to the plasma process as a function of the received data, and
   supply, at the power output, the generated power to the plasma process in place of the additional power supply.

* * * * *